United States Patent [19]
Voogel et al.

[11] Patent Number: 6,033,938
[45] Date of Patent: *Mar. 7, 2000

[54] ANTIFUSE WITH IMPROVED ON-STATE RELIABILITY

[75] Inventors: Martin L. Voogel, Santa Clara; Yakov Karpovich, Campbell; Michael J. Hart, Palo Alto, all of Calif.

[73] Assignee: Xilinx, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/751,193

[22] Filed: Nov. 15, 1996

[51] Int. Cl.$^7$ .................................................. H01L 21/82
[52] U.S. Cl. ........................... 438/131; 438/467; 438/600
[58] Field of Search ................... 437/47, 48, 52, 437/60, 927; 438/131, 467, 600

[56] References Cited

U.S. PATENT DOCUMENTS

| | | | |
|---|---|---|---|
| 4,456,679 | 6/1984 | Leyrer et al. | 430/326 |
| 5,322,812 | 6/1994 | Dixit et al. | 437/60 |
| 5,399,527 | 3/1995 | Tabara | 437/194 |
| 5,475,253 | 12/1995 | Look et al. | 257/530 |
| 5,484,746 | 1/1996 | Ichikawa et al. | 437/83 |
| 5,502,000 | 3/1996 | Look et al. | 437/60 |
| 5,543,656 | 8/1996 | Yen et al. | 257/530 |
| 5,565,702 | 10/1996 | Tamura et al. | 257/530 |
| 5,633,194 | 5/1997 | Selvakumar et al. | 117/103 |
| 5,786,240 | 7/1998 | Look et al. | 438/131 |

OTHER PUBLICATIONS

Ali Iranmanesh, Yakov Karpovich, Sukyoon Yoon, "Antifuse Reliability and Link Formation Models", pp. 90–94, IEEE 1994 International Integrated Reliability Workshop Final Report, sponsored by IEEE Electron Devices Society and the IEEE Reliability Society, 1994.

Robert F. Pierret, "Ohmic Contacts", Semiconductor Device Fundamentals, School of Electrical and Computer Engineering, Purdue University, 1996, pp. 498–500.

*Primary Examiner*—Joni Chang
*Attorney, Agent, or Firm*—Michael J. Casey; Jeanette S. Harms

[57] ABSTRACT

Treatment of the positive electrode interface of an antifuse provides significantly improved on-state reliability. Treatments include, but are not limited to, a plasma etch using carbon tetrafluoride ($CF_4$), a sputter clean using Argon, and wet chemical treatments using dimethyl formamide (and water) or a resist developer.

11 Claims, 2 Drawing Sheets

ANTIFUSE WITH IMPROVED ON-STATE RELIABILITY

BACKGROUND OF THE INVENTION

1. Field of the Invention

The present invention relates to an antifuse, and particularly to an antifuse which improves on-state reliability.

2. Description of the Related Art

Antifuses are well known in the art of programmable logic devices. An antifuse is a structure which is non-conductive when manufactured, but becomes permanently conductive by applying a predetermined voltage across its terminals (i.e. programming the antifuse). Antifuses are typically used in programmable logic devices to programmably interconnect conductive lines.

FIG. 1 illustrates a cross-section of a typical antifuse 110 having a substrate 100, a first insulating layer 101 formed on substrate 100, and a first conductive layer 102 formed on first insulating layer 101. Typically, first conductive layer 102 includes aluminum. A first barrier metal layer 103 is formed and patterned on first conductive layer 102 (wherein first barrier metal layer 103 and first conductive layer 102 in combination are referred to as the bottom electrode). A second insulating layer 104 is deposited and etched to form a via to barrier metal layer 103. An amorphous silicon layer 105 is formed over second insulating layer 104 and first barrier metal layer 103. A second barrier metal layer 106 as well as a second conductive layer 107 are formed on amorphous silicon layer 105 (wherein second barrier metal layer 106 and second conductive layer 107 in combination are referred to as the top electrode).

During programming, a conductive link (not shown) is formed between first barrier metal layer 103 and second barrier metal layer 106 by applying a positive voltage to either the top or the bottom electrode (referenced herein as the positive electrode). The electrode not receiving the positive voltage (i.e. the negative electrode) becomes heated and melts the associated barrier metal layer through the amorphous silicon layer, thereby forming the conductive link. For additional information regarding the formation of the conductive link, see "Antifuse Reliability and Link Formation Models", A. Iranmanesh et al., 1994 International Integrated Reliability Workshop Final Report, IEEE, which is incorporated herein by reference. Note that barrier metal layers 103 and 106 prevent the interdiffusion of the aluminum with the silicon in amorphous silicon layer 105.

As known by those skilled in the art, this conductive link has an associated resistance. Typically, this resistance increases somewhat over time. This phenomena is referred to herein as $R_{on\ aging}$. If the resistance is too high, the functioning of the antifuse may be adversely affected, even resulting in failure. In a programmable logic device, the failure of one antifuse may be disastrous since the programmed circuit may no longer be realized in the integrated circuit. Thus, a goal of any antifuse process is to improve $R_{on\ aging}$ as much as possible. Therefore, a need arises to provide a method of improving $R_{on\ aging}$, thereby ensuring greater on-state reliability of the antifuses.

SUMMARY OF THE INVENTION

In accordance with the present invention, the interface between the positive electrode (during programming) and the amorphous silicon layer of the antifuse is treated, thereby resulting in significantly improved on-state reliability. Treatments of the present invention include, but are not limited to, a plasma etch using carbon tetrafluoride ($CF_4$), a sputter clean using Argon, and wet chemical treatments using dimethyl formamide (and water) or a resist developer.

DETAILED DESCRIPTION OF THE DRAWINGS

In accordance with one embodiment of the present invention in which the positive electrode is the bottom electrode, cleaning the bottom electrode interface (i.e. the top of first conductive layer 102) of the antifuse before amorphous silicon deposition improves the $R_{on\ aging}$ and thus the on-state reliability of the antifuse. In another embodiment of the present invention in which the positive electrode is the top electrode, cleaning the top electrode interface (i.e. the top of amorphous silicon layer 105) before deposition of barrier metal layer 106 improves the $R_{onaging}$ and thus the on-state reliability of the antifuse.

During programming of a typical antifuse, a thin layer of oxide and organic material at the positive electrode interface prevents the conductive link from making a good weld with the positive electrode. This bad weld can result in a resistance increase over time as the conductive link becomes disconnected from the positive electrode.

The acceptable range of resistance for any antifuse is determined by its application. For example, an antifuse in a high speed path must have a lower resistance relative to another antifuse in a low speed path. By careful design of the programming circuitry and algorithms, immediately after programming, 100% of the antifuses on a chip exhibit a resistance between 40–60 Ohms. Over time, sometimes in a matter of minutes, less than 100% of the antifuses exhibit this same resistance range. Due to the statistical nature of the use of antifuses in circuit applications, a certain percentage of $R_{on\ aging}$ may be acceptable. However, a much higher resistance, such as over 1000 Ohms can cause an circuit malfunction, once again depending on the application.

Figure 2:
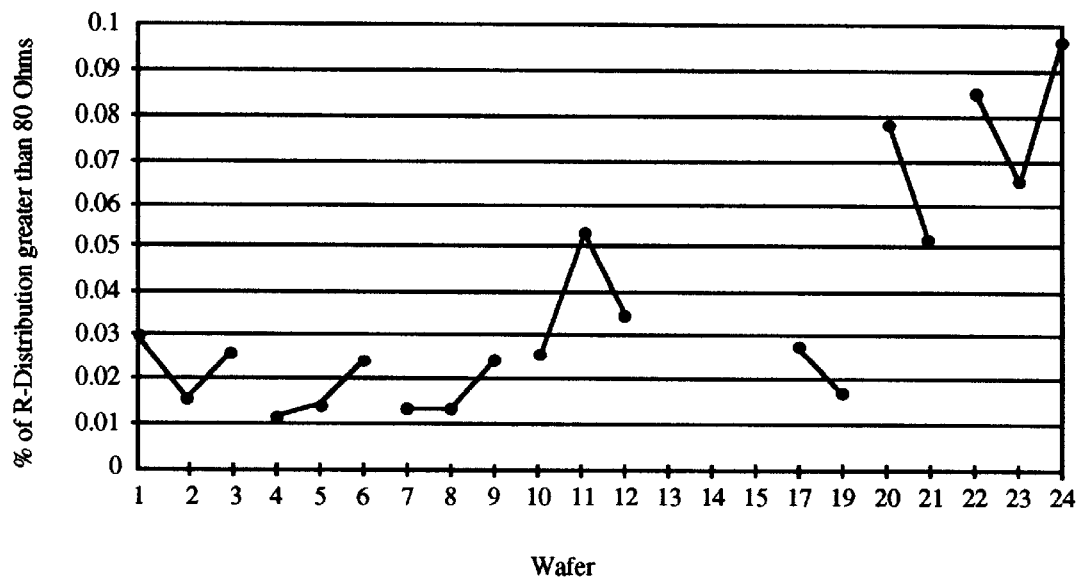
FIG. 2 is a graph showing the resistance distribution of multiple wafers of the present invention after 4 minutes.
Figure 3:
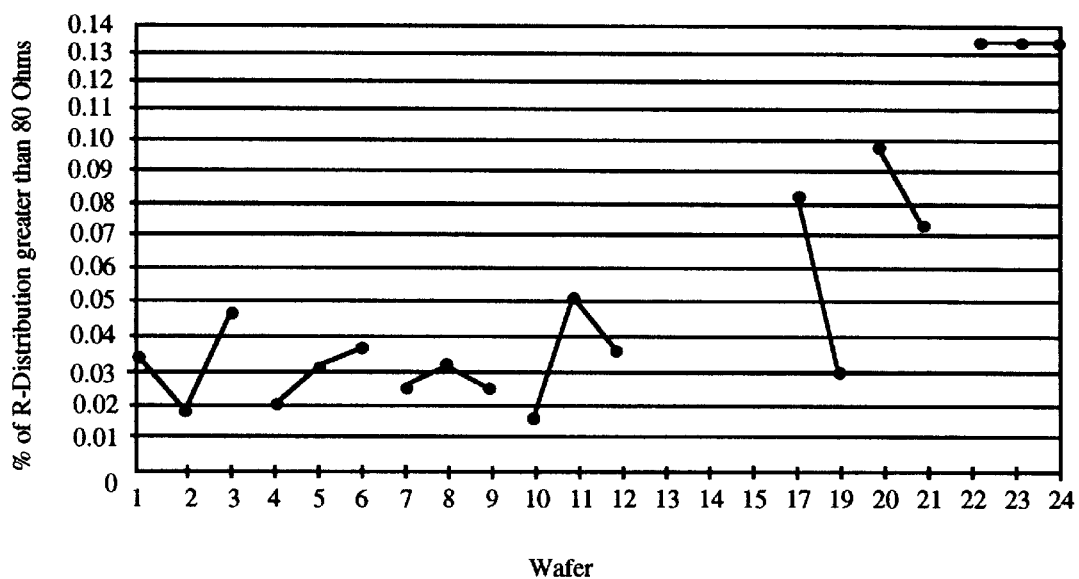
FIG. 3 is a graph showing the resistance distribution of multiple wafers of the present invention after 2 weeks.

For purposes of evaluating the antifuses of the present invention, antifuses having measured resistances greater than 80 Ohms were selected. Note that this resistance range is at least 20 Ohms higher than the initially programmed resistance range. FIGS. 2 and 3 show the percentage of resistance distribution for various wafers (having bottom electrode treatments) greater than 80 Ohms after four minutes and two weeks, respectively, after programming (wherein the bottom electrode was the positive electrode during programming). Note again that directly after programming, no antifuses have resistances greater than 60 Ohms. Illustrative bottom electrode interface treatments for various wafers are summarized in Table 1 below.

TABLE 1

| Wafers | Bottom Electrode Treatments |
| --- | --- |
| 1, 2, 3 | $CF_4$ 10 sccm, 250 W, 4.5 sec (TCA) |
| 4, 5, 6 | $CF_4$ 10 sccm, 250 W, 6.5 sec (TCA) |
| 7, 8, 9 | $CF_4$ 10 sccm, 250 W, 8.5 sec (TCA) |
| 10, 11, 12 | Ar, 450 W, 103 sec (ILC 1051) |
| 17, 19: | Dimethyl formamide + $H_2O$ (wet treatment) |

TABLE 1-continued

| Wafers | Bottom Electrode Treatments |
|---|---|
| 20, 21: | Resist Developer (C30) (wet treatment) |
| 22, 23, 24 | None | wherein TCA refers to a plasma etch done with a TCA Etcher manufactured by Tokyo Ohka Kogyo Ltd., ILC 1051 refers to a sputter clean done with an Anelva 1051 Etcher, and C30 refers to any known resist developer (including one by the brand name C30). An illustrative top electrode (wherein the top electrode is the positive electrode during programming) interface treatment includes, but is not limited to, a sputter clean using Argon under the conditions indicated above in Table 1.

As shown by comparing wafers 22, 23, and 24 with the other wafers, treating the positive electrode interfaces of the antifuses results in a lower percentage of resistance distribution greater than 80 Ohms. In accordance with some treatments, this improvement is actually on an order of magnitude. Because the present invention reduces the $R_{on\ aging}$ compared to the prior art in which no treatment of the positive electrode is performed, it logically follows that the present invention also improves on-state reliability of the antifuses.

Figure 1:
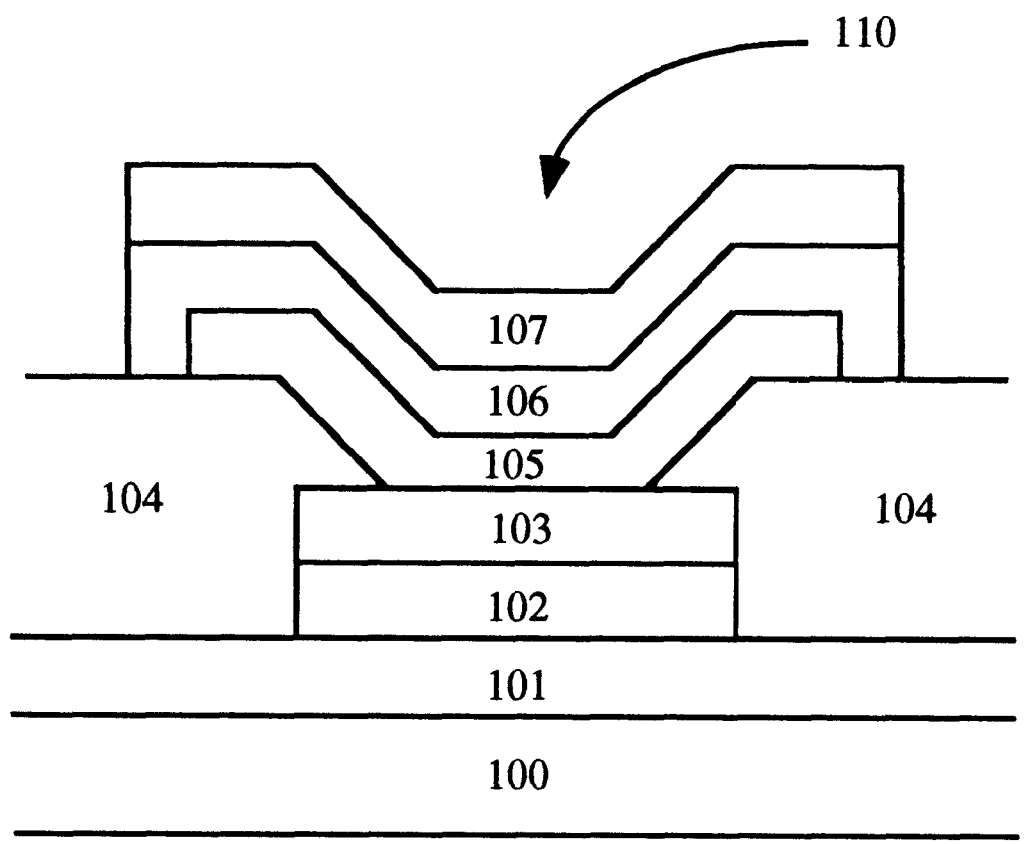
FIG. 1 illustrates a cross-section of a typical antifuse.

Although the present invention has been described in reference to an antifuse structure shown in FIG. 1, other antifuse structures are also possible. For example, other antifuse structures include those described in U.S. Pat. No. 5,475,253 and U.S. Ser. No. 08/672,185 which are incorporated by reference herein. Other embodiments, including other interface electrode treatments, will be apparent to those skilled in art in light of the specification. Those skilled in the art will also recognize that for bidirectional pulse programming the initial pulse determines which electrode is considered positive for purposes of this invention. Specifically, the electrode receiving the first positive voltage pulse is considered the positive electrode. The present invention is defined by the claims appended hereto.

We claim:

1. A method of improving on-state reliability of an antifuse consisting of the steps of:

forming a first conductive layer;

forming a barrier metal layer on said first conductive layer;

forming an amorphous silicon layer on said barrier metal layer;

forming a second conductive layer on said amorphous silicon layer, wherein (1) if said first conductive layer is a positive electrode, then removing grown oxide on a bottom electrode interface and (2) if said second conductive layer is the positive electrode, then removing grown oxide on a top electrode interface.

2. The method of claim 1 wherein said removing for (1) includes using carbon tetrafloride (CF4).

3. The method of claim 1 wherein said removing includes Argon.

4. The method of claim 1 wherein said removing for (1) includes using dimethyl formamide.

5. The method of claim 1 wherein said grown oxide includes organic material.

6. A method of improving on-state reliability of an antifuse consisting of the steps of:

forming a first conductive layer forming a barrier metal layer on said first conductive layer;

forming an amorphous silicon layer on said barrier metal layer; and forming a second conductive layer on said amorphous silicon layer, wherein (1) if said first conductive layer is a positive electrode, then removing grown oxide on a bottom electrode interface using a sputter clean using Argon and (2) if said second conductive layer is the positive electrode, then removing grown oxide on a top electrode interface using a sputter clean using Argon.

7. The method of claim 6 wherein said grown oxide includes organic material.

8. A method of improving on-state reliability of an antifuse consisting of the steps of:

forming a first conductive layer;

forming a barrier metal layer on said first conductive layer;

forming an amorphous silicon layer on said barrier metal layer; and forming a second conductive layer on said amorphous silicon layer, wherein (1) if said first conductive layer is a positive electrode, then cleaning a bottom electrode interface and (2) if said second conductive layer is the positive electrode, then cleaning a top electrode interface.

9. The method of claim 8, wherein said cleaning for (1) includes using carbon tetrafloride (CF4).

10. The method of claim 8, wherein said cleaning includes using Argon.

11. The method of claim 8 wherein said cleaning for (1) includes dimethyl formamide.

* * * * *